United States Patent
Cho

(10) Patent No.: US 8,217,449 B2
(45) Date of Patent: Jul. 10, 2012

(54) SEMICONDUCTOR DEVICE AND METHOD FOR FORMING THE SAME

(75) Inventor: Young Man Cho, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 34 days.

(21) Appl. No.: 12/840,207

(22) Filed: Jul. 20, 2010

(65) Prior Publication Data

US 2011/0147833 A1    Jun. 23, 2011

(30) Foreign Application Priority Data

Dec. 21, 2009  (KR) .................. 10-2009-0127900

(51) Int. Cl.
*H01L 23/48*  (2006.01)

(52) U.S. Cl. ........ 257/330; 257/332; 257/506; 257/773; 257/E29.262; 257/E29.112

(58) Field of Classification Search .................. 257/304, 257/308, 311, 328, 330, 331, 332, 506, 510, 257/773, 774, 776, E29.262, E29.112
See application file for complete search history.

(56) References Cited

U.S. PATENT DOCUMENTS

| 2011/0147833 A1* | 6/2011 | Cho | 257/330 |
| 2012/0012912 A1* | 1/2012 | Kwon | 257/302 |

FOREIGN PATENT DOCUMENTS

| KR | 100843711 B1 | 6/2008 |
| KR | 1020090026658 A | 3/2009 |
| KR | 1020090094018 A | 9/2009 |

* cited by examiner

*Primary Examiner* — Jack Chen

(57) ABSTRACT

A semiconductor device includes a semiconductor substrate including an active area defined by an device isolation region, a buried gate formed on both side walls of a trench formed in the semiconductor substrate, and a storage node contact which is buried between the buried gates, and is connected to the active region of a middle portion of the trench and the device isolation region.

7 Claims, 5 Drawing Sheets

SEMICONDUCTOR DEVICE AND METHOD FOR FORMING THE SAME

CROSS-REFERENCES TO RELATED APPLICATIONS

The present application claims priority to Korean patent application number 10-2009-0127900, filed on Dec. 21, 2009, which is incorporated by reference in its entirety.

BACKGROUND OF THE INVENTION

The present invention relates to a semiconductor device and a method of forming the semiconductor device, and more particularly, to a semiconductor device capable of substantially preventing the generation of a void when forming a buried gate electrode.

Among semiconductor memory devices, a dynamic random access memory (DRAM) includes a plurality of unit cells each of which consists of a capacitor and a transistor. Here, the capacitor is used to temporarily store data, and the transistor is used to transmit data between a bit line and the capacitor in response to a control signal supplied through a word line. The transistor consists of three regions which are a gate, a source and a drain. Electric charges move between the source and the drain according to the control signal inputted to the gate. The flow of electric charges between the source and the drain is performed through a channel region, and the channel uses a characteristic of the semiconductor.

When a general transistor is formed on a semiconductor substrate, a source and a drain thereof are formed by forming a gate on the semiconductor substrate and doping impurities in portions of the semiconductor substrate that are at both sides of the gate. In such a case, a region between the source and the drain under the gate becomes a channel region of the transistor. The transistor having such a horizontal channel region occupies a specific area of the semiconductor substrate. In the case of a complicated semiconductor memory device, it is difficult to reduce the entire area because the memory device includes a plurality of transistors.

If the entire area of the semiconductor memory device is reduced, the number of semiconductor memory devices formed in one wafer can be increased, resulting in improving productivity. Several methods have been suggested in order to reduce the entire area of the semiconductor memory device. One method is to use a recess gate where a channel region is formed along a curved surface of a recess formed in a substrate, instead of the existing planar gate having a horizontal channel region. Another method is to use a buried gate which is buried in a recess.

BRIEF SUMMARY OF THE INVENTION

Embodiments of the present invention are provided to solve a problem that a void is generated in a lower portion when forming a buried gate. The void may be generated by a narrow width of a recess defining the buried gate when forming the buried gate.

According to an embodiment of the present invention, a semiconductor device comprises a semiconductor substrate including an active region defined by an device isolation region, buried gates formed on a sidewall of a trench formed in the semiconductor substrate, a storage node contact coupled to the active region and the device isolation region at a middle portion of the trench.

Preferably, a width of the trench is larger 2.5 to 3 times wider than that of the buried gate. The buried gate comprises a gate oxide layer, gate electrode, a passivation layer pattern having a spacer shape formed on the sidewall of the trench and over the gate electrode.

In accordance with an embodiment of the present invention, a semiconductor device further comprises a storage noded contact provided between the buried gates. An upper portion of the buried gate and that of the hard mask layer are at substantially the same level.

In accordance with an embodiment of the present invention, a semiconductor device further comprises a bit line contact coupled with the active region, a bit line formed over the bit line contact. And a spacer provided a sidewall of the storage node contact.

According to an embodiment of the present invention, a method of forming a semiconductor device comprises forming a trench in a semiconductor substrate including an active area defined by an device isolation region, forming buried gates on a sidewall of the trench, forming a storage node contact to be coupled to the active region and the device isolation region at a middle portion of the trench.

Forming a trench comprises forming a hard mask layer on the semiconductor substrate, etching the hard mask layer and the semiconductor substrate using a photoresist pattern defining the trench as an etching mask.

The trench is formed larger 2.5 to 3 times wider than the buried gate. Forming a buried gate comprises forming a gate electrode filling in a lower portion of the trench, forming a passivation layer pattern having a spacer shape on the sidewall of the trench over the d gate electrode layer, etching the gate electrode layer using the passivation layer pattern as an etching mask. Forming the gate electrode layer comprises forming a gate electrode material filling the trench, and performing a dry etch or a wet etching on the gate electrode material. Forming a passivation layer pattern comprises forming a passivation layer over the gate electrode layer, performing an etch back process on the passivation layer.

In accordance with an embodiment of the present invention, after forming a buried gate, a method of forming a semiconductor device further comprises forming a first interlayer insulating layer having substantially the same height as the buried gates, forming a bit line contact coupled to the active area, forming a bit line coupled to the bit line contact.

Forming a storage node contact comprises forming a second interlayer insulating layer over the bit line, forming a storage node contact area by etching the second interlayer insulating layer and the first interlayer insulating layer until portions of the active region and the device isolation region disposed between the buried gates are exposed, forming a spacer for storage node contact on side wall of the contact region, filling the contact region including the spacer with a conductive layer, performing a planarization process on the spacer and the conductive layer until the bit line is exposed. The conductive layer comprises a polysilicon layer.

The present invention prevents the generation of a void when forming a buried gate electrode by making a width of a trench 2.5 to 3 times wider, and prevents deterioration of properties of a semiconductor device due to a void that is generated when forming buried gates by separating buried gate electrodes from each other through self-aligned dry etch.

DESCRIPTION OF EMBODIMENTS

Hereinafter, the present invention is illustrated in detail according to an embodiment of the present invention with reference to attached drawings.

Figure 1:
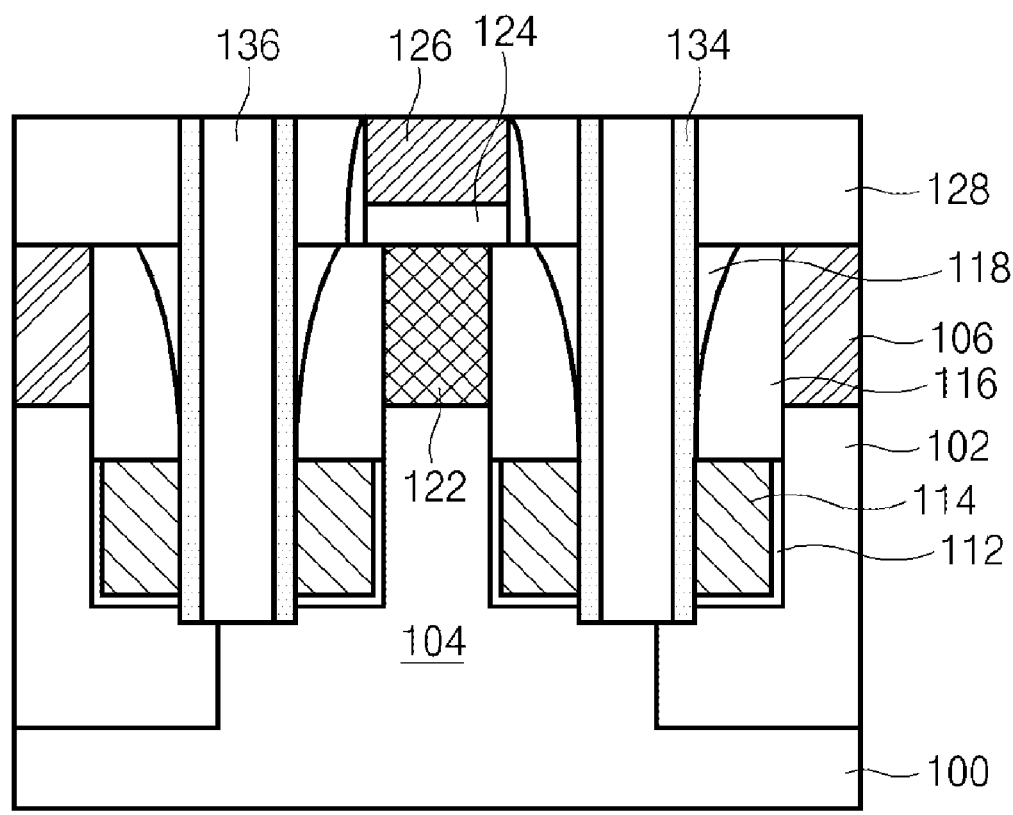
FIG. 1 is a cross-sectional view of a semiconductor device according to an embodiment of the present invention.

FIG. 1 is a cross-sectional view of a semiconductor device according to an embodiment of the present invention. FIGS. 2A to 2H are cross-sectional views showing a method of forming the semiconductor device Referring to FIGS. 1 and 2A to 2H, the semiconductor device includes a buried gate including a passivation (or protection) layer pattern 116 and a gate electrode 114 formed on both sides of a trench 110 that is formed within a semiconductor substrate 100. The semiconductor substrate 100 includes an active region 104 defined by an device isolation region 102, and a storage node contact 136, which is buried between the buried gates, connected to the active region 104 and the device isolation region 102 in a middle portion of the trench 110. The semiconductor device further includes a spacer 134 formed on a sidewall of the storage node contact 136, a bit line contact 122 connected with the active region 104, and a bit line connected with the bit line contact 122. In this embodiment, the trench 110 is 2.5 to 3 times wider than the buried gate electrode 114.

Accordingly, in the semiconductor device of the present invention, the gate electrode is formed to fill in the trench having a width 2.5 to 3 times greater than that of a buried gate, so that it is possible to substantially prevent a void from being generated in the buried gate electrode. The storage node contact 136 is formed in a buried type using the trench having the width which is 2.5 to 3 times greater than that of the buried gate, thereby fundamentally preventing a short from occurring between the bit line and the storage node contact.

Figure 2A:
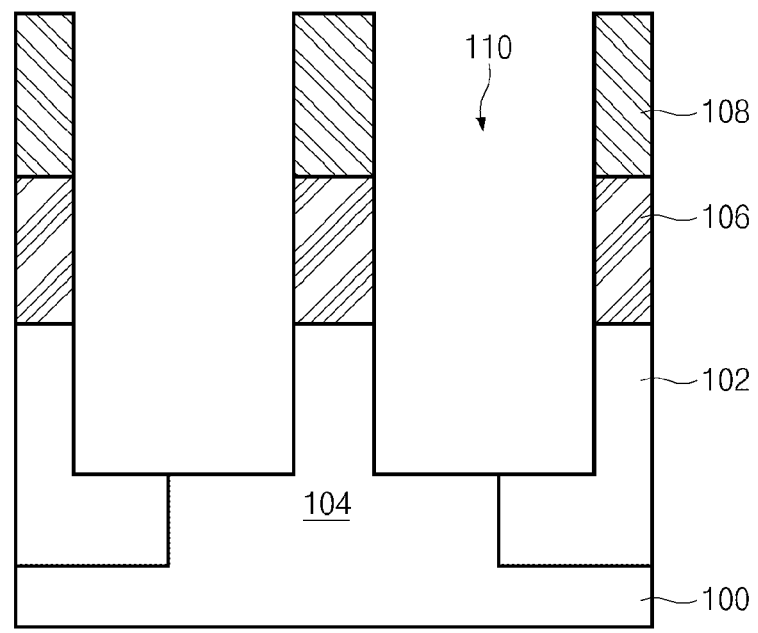
FIGS. 2A to 2H are cross-sectional views showing a method of forming the semiconductor device.

Referring to FIG. 2A, a hard mask layer 106 is formed on the semiconductor substrate 100 including the active region 104 defined by the device isolation region 102.

After a photoresist pattern 108 defining a trench for forming the buried gate is formed, the hard mask layer 106, the device isolation region 102 and the active region 104 are etched using the photoresist pattern 108 as an etching mask, thereby forming the trench 110. Here, it is preferable that the trench 110 is formed to have a width that is 2.5 to 3 times greater than that of the buried gate electrode 114 as shown in FIG. 2C. Then, the photoresist pattern 108 is removed.

Figure 2B:
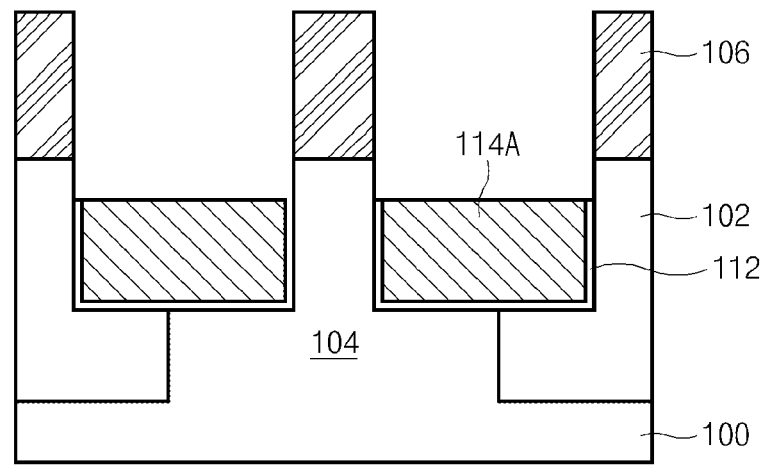
Figure 2C:
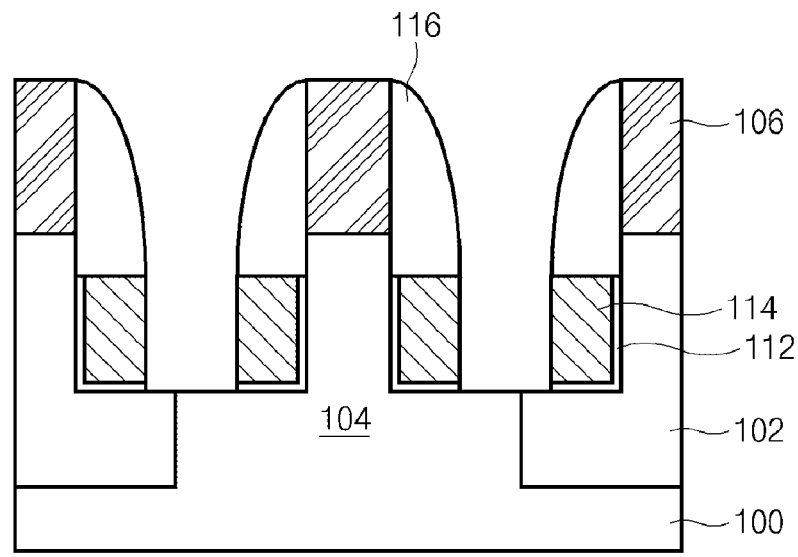

Referring to FIG. 2B, after an oxide layer and a gate electrode material are formed on the trench 110, a dry or wet etching process is performed on a resultant structure including the oxide layer and the gate electrode material so that a gate oxide layer 112 and a gate electrode layer 114A are formed in a lower portion of the trench 110 over the semiconductor substrate 100. Since the gate electrode layer 114A partially fills the trench 110 greater than a typical trench, it is preferable that the gate electrode layer 114A is formed without generating a void in the trench 110 unlike a typical technology.

Referring to FIG. 2C, after a protection layer is formed on the gate electrode layer 114A, an etch-back process is performed so that the protection layer pattern 116 having a spacer shape is formed on a sidewall of the trench 110. Then, the gate electrode layer 114A and the gate oxide layer 112 are etched and separated using the protection layer pattern 116 as an etching mask until the active region 104 and the device isolation region 102 are exposed.

Here, a self aligning method may be used to separate the gate electrode layer 114A and the gate oxide layer 112 using the protection layer pattern 116 as the etching mask. In this process, the gate electrode 114 is formed. The width of the trench 110 may be extended to facilitate the forming of the gate electrode layer 114A. Accordingly, the generation of a void during the filling of a typical trench having a narrow width can be prevented.

Figure 2D:
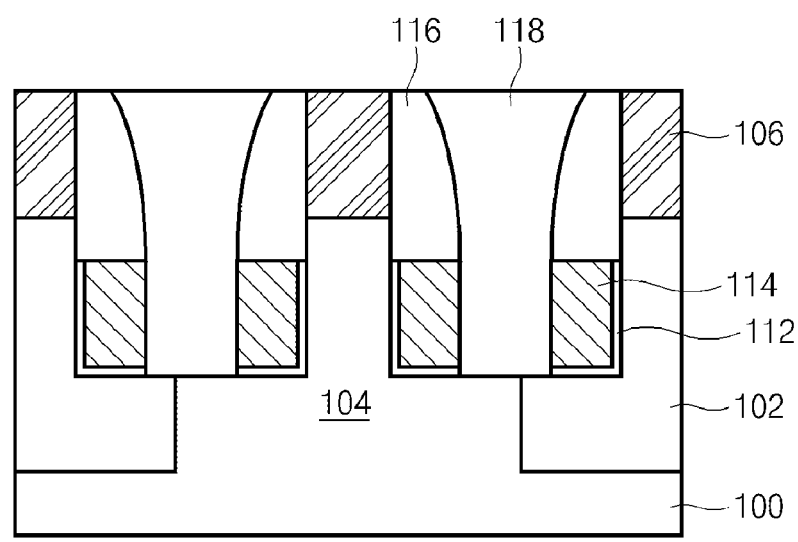

Referring to FIG. 2D, after an interlayer insulating layer 118 is formed on the whole surface of a resultant structure of FIG. 2C, a planarization process is performed on the interlayer insulating layer 118 until the protection layer pattern 116 is exposed.

Figure 2E:
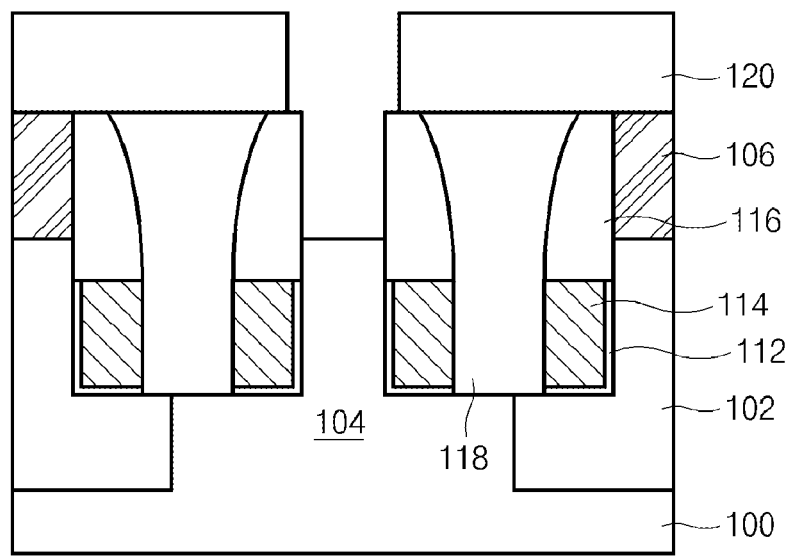

Referring to FIG. 2E, after a photoresist pattern 120 is formed to expose the hard mask layer 106 formed on the active region 104. An etching process is performed on the exposed hard mask layer 106 using the photoresist pattern 120 as an etching mask, thereby removing the hard mask layer 106 on the active region 104. Here, an area where the hard mask layer 106 is removed may be a reserved area where a bit line contact is formed in subsequent processes. Then, the photoresist pattern 120 is removed.

Figure 2F:
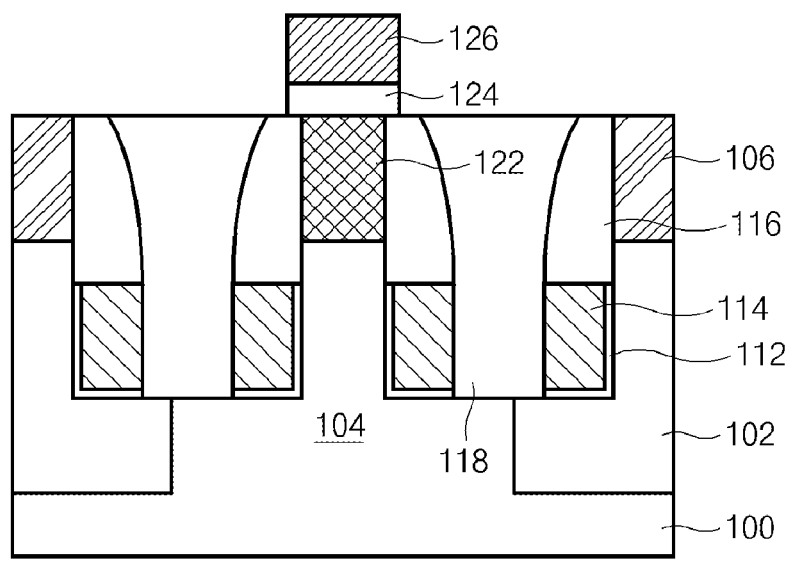

Referring to FIG. 2F, after a conductive layer, e.g., a polysilicon layer, for the bit line contact is formed in the reserved area, a dry etch-back or planarization process is performed on the polysilicon layer so that the bit line contact 122 is defined. Then, a bit line electrode layer and a hard mask layer are formed on the whole surface of a resultant structure of FIG. 2E. A photoresist pattern (not shown) defining the bit line is formed and used as an etching mask to etch the bit line electrode layer and the hard mask layer, so that a hard mask pattern 126 and a bit line 124 are formed.

Figure 2G:
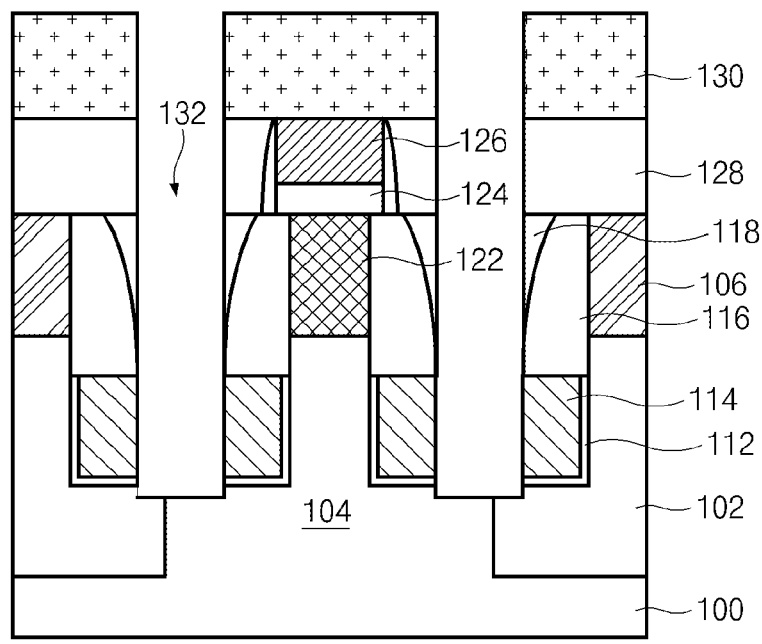

Referring to FIG. 2G, an interlayer insulating layer 128 is formed on the whole surface of a resultant structure including the bit line 124 and hard mask pattern 126. Then, a photoresist pattern 130 for defining the storage node contact is formed on the interlayer insulating layer 128. Subsequently, the interlayer insulating layers 128 and 118 are etched using the photoresist pattern 130 as an etching mask until the active region 104 and the device isolation region 102 are exposed, so that a contact region 132 is formed. Then, the photoresist pattern 130 is removed.

Figure 2H:
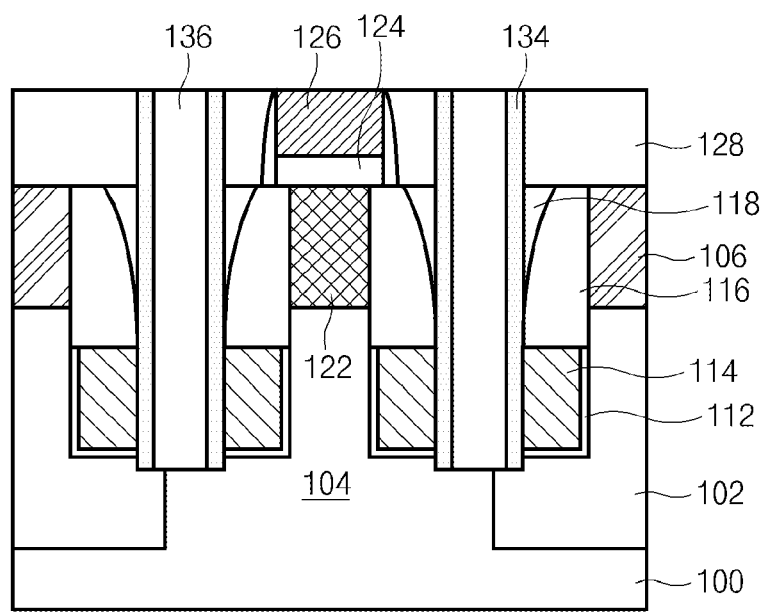

Referring to FIG. 2H, the spacer 134 for the storage node contact is formed on a sidewall of contact region 132. Then, after a conductive layer, e.g., a polysilicon layer, for the storage node contact is formed on a resultant structure including the contact region 132, a planarization process is performed on the polysilicon layer until the interlayer insulating layer 128 is exposed, so that the storage node contact 136 is formed. At this time, since the storage node contact 136 has a form buried in the semiconductor substrate 100 like a buried gate instead of a typical form protruding over the semiconductor substrate 100, a short-circuit with the bit line can be fundamentally prevented.

As described above, in accordance with the embodiments of the present invention, the width of the trench is extended to broadly form the buried gate electrode in the trench, such that the generation of a void caused in the process of filling the trench having a narrow width can be fundamentally prevented and the characteristic of the semiconductor device can be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
   a semiconductor substrate including an active region defined by a device isolation region;
   buried gates formed on a sidewall of a trench formed in the semiconductor substrate; and
   a storage node contact coupled to the semiconductor substrate and the device isolation region at a middle portion of the trench.

2. The semiconductor device of claim 1, wherein a width of the trench is 2.5 to 3 times greater than that of the buried gate.

3. The semiconductor device of claim 1, wherein the buried gate comprises:
   a gate oxide layer;
   a gate electrode; and
   a passivation layer pattern having a spacer shape formed on the sidewall of the trench and over the gate electrode.

4. The semiconductor device of claim 1, further comprising the storage node contact provided between the buried gates.

5. The semiconductor device of claim 4, wherein an upper portion of the buried gate and a hard mask layer are at substantially the same level.

6. The semiconductor device of claim 1, further comprising:
   a bit line contact coupled with the active region; and
   a bit line formed over the bit line contact.

7. The semiconductor device of claim 1, further comprising a spacer provided on a sidewall of the storage node contact.

* * * * *